US009019022B2

(12) United States Patent
Liu

(10) Patent No.: US 9,019,022 B2
(45) Date of Patent: Apr. 28, 2015

(54) OVEN CONTROLLED CRYSTAL OSCILLATOR AND MANUFACTURING METHOD THEREOF

(71) Applicant: Guangdong Dapu Telecom Technology Co., Ltd., Guangdong (CN)

(72) Inventor: Chaosheng Liu, Guangdong (CN)

(73) Assignee: Guangdong Dapu Telecom Technology Co., Ltd., Dongguan, Guangdong (CN)

( * ) Notice: Subject to any disclaimer, the term of this patent is extended or adjusted under 35 U.S.C. 154(b) by 0 days.

(21) Appl. No.: 14/236,587

(22) PCT Filed: Nov. 20, 2012

(86) PCT No.: PCT/CN2012/084869
§ 371 (c)(1),
(2) Date: Jan. 31, 2014

(87) PCT Pub. No.: WO2014/071655
PCT Pub. Date: May 15, 2014

(65) Prior Publication Data
US 2014/0320220 A1 Oct. 30, 2014

(30) Foreign Application Priority Data
Nov. 6, 2012 (CN) .......................... 2012 1 0438939

(51) Int. Cl.
*H03L 1/04* (2006.01)
*H05K 3/30* (2006.01)
(52) U.S. Cl.
CPC ............... *H03L 1/04* (2013.01); *Y10T 29/4913* (2015.01); *H05K 3/30* (2013.01)
(58) Field of Classification Search
USPC ................................................ 331/70, 69
See application file for complete search history.

(56) References Cited

U.S. PATENT DOCUMENTS 6,559,728 B1* 5/2003 Fry .................................. 331/69
2007/0241827 A1 10/2007 Harima

FOREIGN PATENT DOCUMENTS

| CN | 101783649 A | 7/2010 |
| CN | 102035466 A | 4/2011 |
| JP | 2011-9399 A | 1/2011 |
| JP | 2012-85266 A | 4/2012 |
| JP | 2012-90202 A | 5/2012 |
| KR | 10-2010-0055268 A | 5/2010 |

OTHER PUBLICATIONS

WIPO; International Search Report mailed Aug. 15, 2013 in counterpart International Application No. PCT/CN2012/084869.

* cited by examiner

*Primary Examiner* — Joseph Chang
(74) *Attorney, Agent, or Firm* — Snell & Wilmer L.L.P.

(57) ABSTRACT

The present invention discloses an Oven Controlled Crystal Oscillator and a manufacturing method thereof. The Oven Controlled Crystal Oscillator comprises a thermostatic bath, a heating device, a PCB and a signal generating element, where the signal generating element is used for generating a signal of a certain frequency, the heating device, the PCB and the signal generating element are mounted in the thermostatic bath, the signal generating element is mounted in a groove formed on one side of the PCB, while the heating device is mounted against the other side of the PCB that is opposite to the groove. The signal generating element may be a passive crystal resonator or an active crystal oscillator. The Oven Controlled Crystal Oscillator according to the invention is advantageous for a small volume and a high temperature control precision.

10 Claims, 5 Drawing Sheets

US 9,019,022 B2

OVEN CONTROLLED CRYSTAL OSCILLATOR AND MANUFACTURING METHOD THEREOF

CROSS-REFERENCE TO RELATED APPLICATIONS

This application is the national stage entry of International Application No. PCT/CN2012/084869, entitled "OVEN CONTROLLED CRYSTAL OSCILLATOR AND MANUFACTURING METHOD THEREOF," filed on Dec. 6, 2012, which claims the right of priority based on Chinese Patent Application No. 201210438939.7 entitled "CONSTANT TEMPERATURE CONTROL CRYSTAL OSCILLATOR AND MANUFACTURING METHOD THEREOF" filed on Nov. 6, 2012, which is incorporated herein by reference and assigned to the assignee herein.

TECHNICAL FIELD

The present invention relates to crystal oscillator technologies, in particular to an Oven Controlled Crystal Oscillator and a manufacturing method thereof

TECHNICAL BACKGROUND

A quartz crystal oscillator is very precise and stable, and has been widely used in various oscillating circuits for a color TV set, a computer and a remote controller, as well as used in a communication system as a frequency generator, to generate a clock signal for a data processing device and to provide a reference signal for a particular system.

So far, an Oven Controlled Crystal Oscillator (OCXO) is a crystal oscillator with the best frequency stability and precision and is excellent in performances such as aging rate, temperature stability, long-term stability and short-term stability, and hence has been widely used in various fields as a precise time-frequency signal source.

As shown in FIG. 1, in an existing Oven Controlled Crystal Oscillator, a crystal resonator 20 and a heating device 30 for direct heating are mounted on both sides of a Printed Circuit Board (PCB) 10, respectively. Such temperature control manner is poor in temperature control precision in that if the ambient temperature changes, a part of the crystal resonator 20 that is farthest from the heating source is likely to be influenced by the ambient temperature change.

In another temperature control manner as shown in FIG. 2, a crystal resonator 20 is mounted on an inner PCB 10 accommodated in a metallic thermal conductive chamber 40, and a heating device 30 connected with and powered by an outer PCB 50 is arranged on the external side of the metallic thermal conductive chamber 40. However, this manner introduces additionally the metallic thermal conductive chamber and the outer PCB for the purpose of the heating conducted indirectly via the metallic thermal conductive chamber, so that both the component volume and power consumption is significantly increased, and both costs and manufacturing process complexity is increased accordingly.

Therefore, there is an urgent need for an OCXO with a small volume and a high temperature control precision.

SUMMARY OF THE INVENTION

The present invention provides an Oven Controlled Crystal Oscillator and a manufacturing method thereof, for the purpose of improving the temperature control precision while maintaining a relative small volume of the Oven Controlled Crystal Oscillator.

The present invention provides an Oven Controlled Crystal Oscillator including a thermostatic bath, a heating device, a PCB and a signal generating element, where the signal generating element is used for generating a signal of a certain frequency; the heating device, the PCB and the signal generating element are mounted in the thermostatic bath; and the signal generating element is mounted in a groove formed on one side of the PCB, while the heating device is mounted against the other side of the PCB that is opposite to the groove.

Preferably, the PCB is provided with a plurality of thermal conductive through holes passing through the PCB at the bottom of the groove.

Preferably, the PCB is provided with a plurality of thermal conductive through holes passing through the PCB at the bottom of the groove and around the groove.

Preferably, the depth of the groove is larger than the thickness of the signal generating element.

Preferably, the depth of the groove is smaller than or equal to the thickness of the signal generating element.

Preferably, the signal generating element includes a passive crystal resonator or an active crystal oscillator.

The present invention further provides a method for manufacturing an Oven Controlled Crystal Oscillator including: forming a groove on one side of a PCB; mounting a signal generating element of the Oven Controlled Crystal Oscillator in the groove; mounting a heating device against the other side of the PCB that is opposite to the groove; and mounting the PCB provided with the heating device and the signal generating element in a thermostatic bath.

Preferably, the method further includes: forming a plurality of thermal conductive through holes passing through the PCB at the bottom of the groove.

Preferably, the method further includes: forming a plurality of thermal conductive through holes passing through the PCB at the bottom of the groove and around the groove.

By mounting the signal generating element in the groove disposed on the PCB, on one hand, the thickness of the Printed Circuit Board between the heating device and the signal generating element is decreased to improve the heating effect, and on the other hand, the signal generating element is partially or entirely enclosed by the groove to achieve an improved heat-insulating property, and the impact of the external temperature change on the temperature of the signal generating element is reduced, thereby improving the precision and stability of the temperature control of a crystal oscillator circuit. Furthermore, thanks to the groove disposed on the PCB, the volume of the Oven Controlled Crystal Oscillator is further decreased, which brings about advantages of a small volume and a high temperature control precision.

DETAILED DESCRIPTION OF THE PREFERRED EMBODIMENTS

Figure 1:
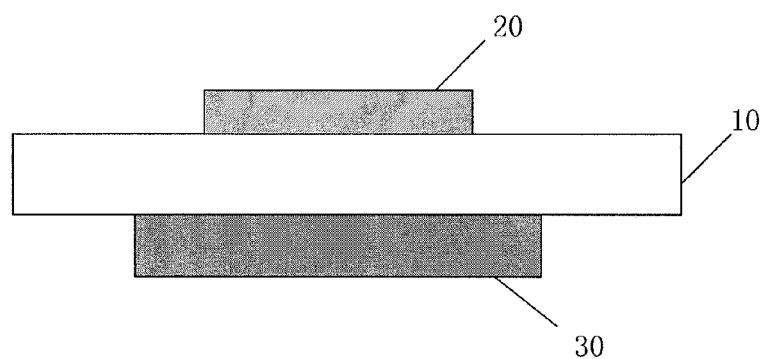
FIG. 1 is a schematic structural diagram of an existing Oven Controlled Crystal Oscillator.
Figure 2:
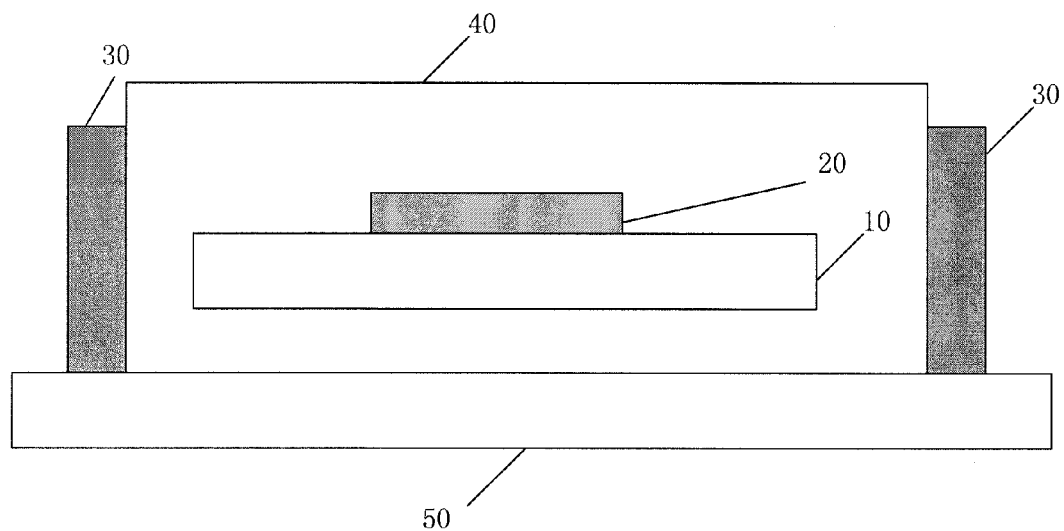
FIG. 2 is a schematic structural diagram of another existing Oven Controlled Crystal Oscillator.

The technical solutions of the present invention are further described below in conjunction with the drawings and specific embodiments. It may be understood that the specific embodiments described herein are only used to explain but not to limit the present invention. Furthermore, it should be noted that parts and steps relevant to the present invention are illustrated in the drawings only for the convenience of description.

Figure 3:
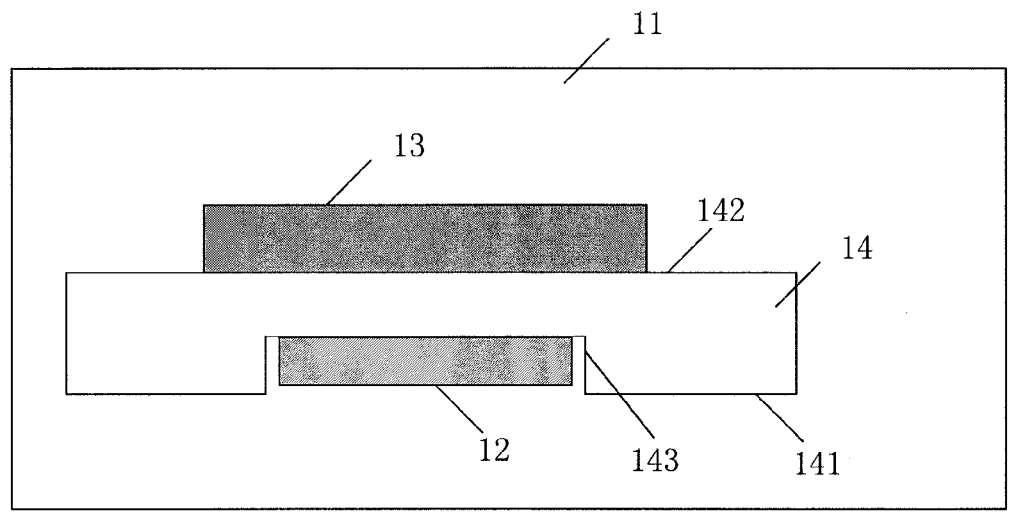
FIG. 3 is a schematic sectional view of an Oven Controlled Crystal Oscillator according to a first embodiment of the invention.
Figure 4:
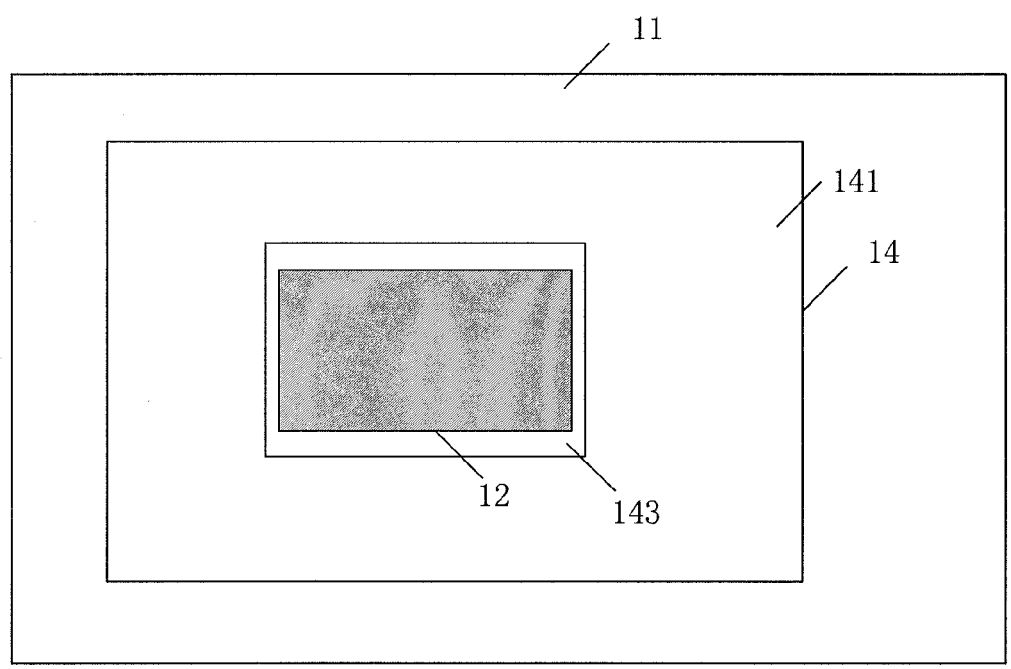
FIG. 4 is a schematic top view of the Oven Controlled Crystal Oscillator according to a first example embodiment of the invention.

FIG. 3 is a schematic sectional view of an Oven Controlled Crystal Oscillator according to a first example embodiment. FIG. 4 is a schematic top view of the Oven Controlled Crystal Oscillator according to the first example embodiment. As shown in FIGS. 3 and 4, the Oven Controlled Crystal Oscillator includes a thermostatic bath 11, a signal generating element 12, a heating device 13, and a Printed Circuit Board 14.

The signal generating element 12 is used for generating a signal of a certain frequency.

The heating device 13, the PCB 14 and the signal generating element 12 are mounted in the thermostatic bath 11.

The PCB 14 has two mounting sides 141 and 142. A crystal resonator 12 is mounted in a groove 143 formed on one of the sides 141 of the PCB 14, while the heating device 13 is mounted against the other side 142 of the PCB 14 that is opposite to the side formed with the groove 143.

By forming the groove 143 on the PCB 14, on one hand, the thickness of the circuit board between the heating device 13 and the signal generating element 12 is decreased to improve the heating effect, and on the other hand, the signal generating element 12 is partially or entirely enclosed by the groove 143 to achieve an improved heat-insulating property, and the impact of the external temperature change on the temperature of the crystal resonator is reduced, thereby improving the precision and stability of the temperature control of a crystal oscillator circuit.

In an example embodiment, a passive crystal resonator may be used as the signal generating element 12, so as to construct an oscillating signal generating circuit by the PCB 14 and the passive crystal resonator.

In another example embodiment, an active crystal oscillator may be used as the signal generating element 12, that is, a relatively small active crystal oscillator including an oscillating signal generating circuit is further thermostatically encapsulated for the purpose of a more reliable performance.

Figure 5:
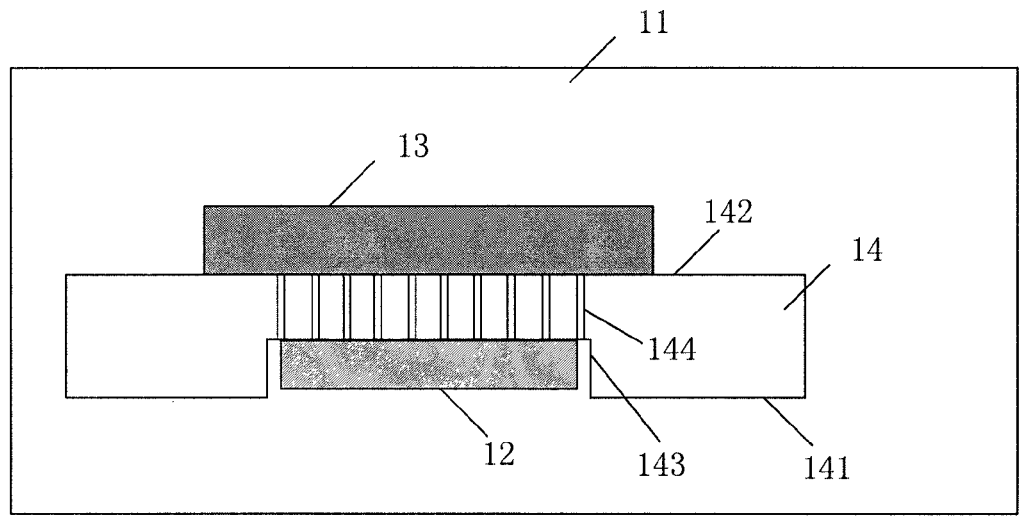
FIG. 5 is a schematic sectional view of an Oven Controlled Crystal Oscillator according to a second example embodiment.

FIG. 5 is a schematic sectional view of an Oven Controlled Crystal Oscillator according to a second example embodiment. In the Oven Controlled Crystal Oscillator according to the second embodiment, as shown in FIG. 5, in addition to the groove 143 provided on the PCB 14 and used for mounting the signal generating element 12, a plurality of thermal conductive through holes 144 passing through the PCB 14 are provided at the bottom of the groove 143.

In this embodiment, with the additional thermal conductive through holes 144, the heat generated by the heating device 13 can be transferred to the proximity of the signal generating element not only through the PCB but also through the thermal conductive through holes 144, therefore the heat conducting efficiency is increased.

Figure 6:
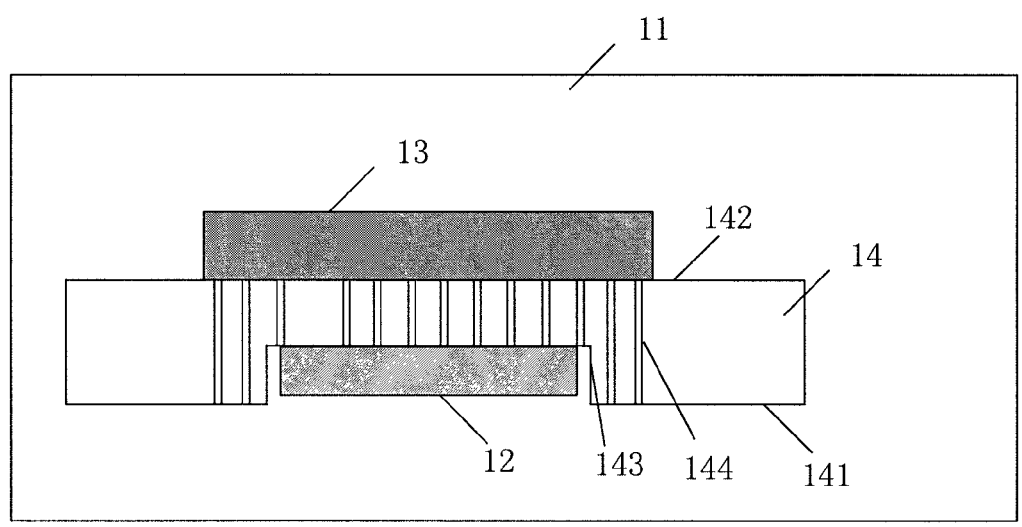
FIG. 6 is a schematic sectional view of an Oven Controlled Crystal Oscillator according to a third example embodiment.
Figure 7:
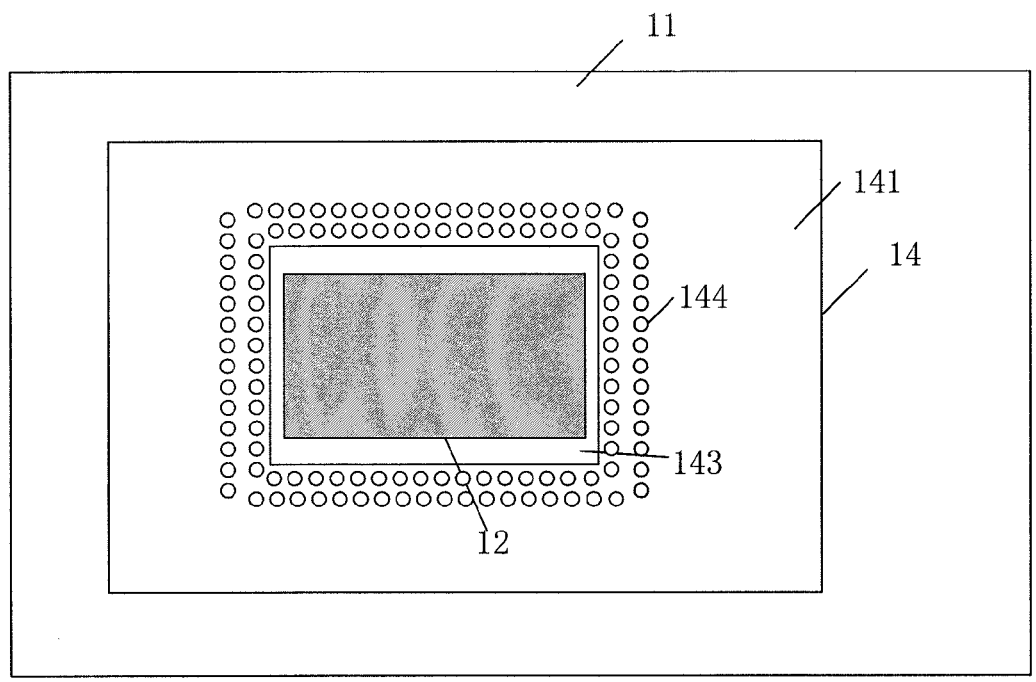
FIG. 7 is a schematic top view of an Oven Controlled Crystal Oscillator according to the third example embodiment.

FIG. 6 is a schematic sectional view of an Oven Controlled Crystal Oscillator according to a third example embodiment. FIG. 7 is a schematic top view of the Oven Controlled Crystal Oscillator according to the third example embodiment. In the Oven Controlled Crystal Oscillator according to the third embodiment, as shown in FIGS. 6 and 7, in addition to the groove 143 provided on the PCB 14 and used for mounting the signal generating element 12, a plurality of thermal conductive through holes 144 passing through the PCB 14 are provided at the bottom of the groove 143; meanwhile, a plurality of thermal conductive through holes 144 passing through the PCB 14 are arranged around the groove 143.

In this embodiment, with the additionally disposed thermal conductive through holes 144 around the groove 143, on one hand, the number of the thermal conductive through holes is increased, and on the other hand, the heat from the heating device 13 can be transferred to the proximity of the sides of the signal generating element more efficiently through the additional thermal conductive through holes 144 around the groove 143, so as to better maintain the stability of the temperature at the proximity of the groove.

In the first, second and third example embodiments, the depth of the groove 143 is larger than that of the signal generating element, so that the signal generating element may be entirely accommodated in the groove 143.

Figure 8:
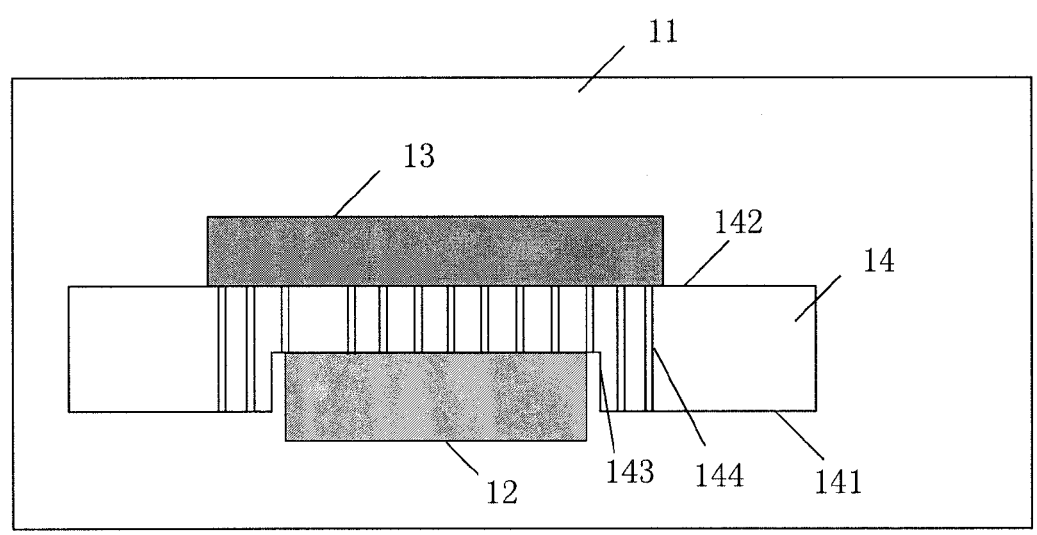
FIG. 8 is a schematic sectional view of an Oven Controlled Crystal Oscillator according to a fourth example embodiment.

FIG. 8 is a schematic sectional view of an Oven Controlled Crystal Oscillator according to a fourth example embodiment. As shown in FIG. 4, the groove 143 disposed on the Oven Controlled Crystal Oscillator according to the fourth embodiment is shallower, that is, the depth of the groove 143 is smaller than or equal to the thickness of the signal generating element, therefore, the signal generating element 12 is partially accommodated in the groove 143. This manner is applicable to a PCB with a relatively small thickness and a relatively weak strength, which is not suitable for providing a deep groove.

Similarly, in other aspects of the embodiment, thermal conductive through holes may be provided at the bottom of and/or around the groove 143 in the Oven Controlled Crystal Oscillator, in order to increase the heat conducting efficiency of the heating device and to control the temperature at the proximity of the signal generating element more precisely.

Figure 9:
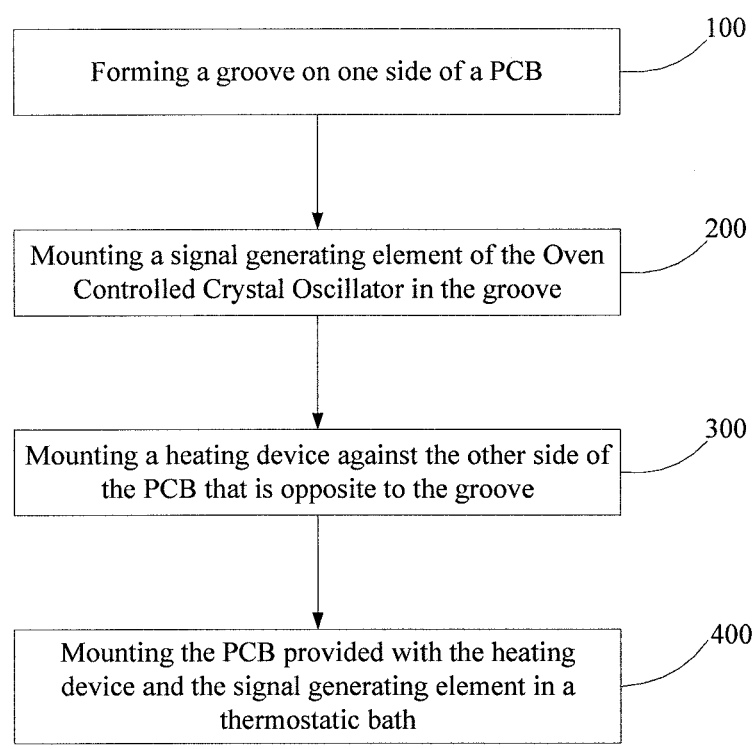
FIG. 9 is a flow chart of a method for manufacturing the Oven Controlled Crystal Oscillator according to an example embodiment.

FIG. 9 is a flow chart of a method for manufacturing the Oven Controlled Crystal Oscillator according to various example embodiments. As shown in FIG. 9, the method includes the following steps 100-400.

At step 100, a groove is formed on one side of a PCB.

At step 200, a signal generating element of the Oven Controlled Crystal Oscillator is mounted in the groove.

At step 300, a heating device is mounted against the other side of the PCB that is opposite to the groove.

At step 400, the PCB provided with the heating device and the signal generating element is mounted in a thermostatic bath.

The order of the step 200 and step 300 is exchangeable. The depth of the groove may be larger than the thickness of the signal generating element so that the signal generating element is entirely accommodated in the groove; or alternatively, the depth of the groove may be smaller than or equal to the thickness of the signal generating element so that the signal generating element is partially accommodated in the groove.

The signal generating element 12 may be a passive crystal resonator, or alternatively, an active crystal oscillator.

In another embodiment according to the present invention, the step 100 may be followed by a step 100A for forming a plurality of thermal conductive through holes passing through the PCB at the bottom of the groove.

In another embodiment according to the present invention, the step 100 may be followed by a step 100B for forming a plurality of thermal conductive through holes passing through the PCB at the bottom of the groove and around the groove.

By mounting the signal generating element in the groove disposed on the PCB in the invention, on one hand, the thickness of the Printed Circuit Board between the heating device and the signal generating element is decreased to improve the heating effect, and on the other hand, the signal generating element is partially or entirely enclosed by the groove to achieve an improved heat-insulating property, and the impact of the external temperature change on the temperature of the signal generating element is reduced, thereby improving the precision and stability of the temperature control of a crystal oscillator circuit. Furthermore, thanks to the groove disposed, the volume of the Oven Controlled Crystal Oscillator is further decreased, which brings about advantages of a small volume and a high temperature control precision.

The preferred embodiments of the invention have been described as above, but are not intended to limit the invention. To those skilled in this art, various changes and variations may be made to the invention. Any change, substitution, modification and so on within the spirit and principle of the invention should fall in the scope of the invention.

The invention claimed is:

1. An Oven Controlled Crystal Oscillator comprising a thermostatic bath, a heating device, a Printed Circuit Board and a signal generating element, wherein
   the signal generating element is used for generating a signal of a certain frequency;
   the heating device, the Printed Circuit Board and the signal generating element are mounted in the thermostatic bath; and
   the signal generating element is mounted in a groove formed on one side of the Printed Circuit Board, and the heating device is mounted against the other side of the Printed Circuit Board that is opposite to the groove.

2. The Oven Controlled Crystal Oscillator of claim 1, wherein the Printed Circuit Board is provided with a plurality of thermal conductive through holes passing through the Printed Circuit Board at the bottom of the groove.

3. The Oven Controlled Crystal Oscillator of claim 1, wherein the Printed Circuit Board is provided with a plurality of thermal conductive through holes passing through the Printed Circuit Board at the bottom of the groove and around the groove.

4. The Oven Controlled Crystal Oscillator of claim 1, wherein the depth of the groove is larger than the thickness of the signal generating element.

5. The Oven Controlled Crystal Oscillator of claim 1, wherein the depth of the groove is smaller than or equal to the thickness of the signal generating element.

6. The Oven Controlled Crystal Oscillator of claim 1, wherein the signal generating element comprises a passive crystal resonator or an active crystal oscillator.

7. A method for manufacturing an Oven Controlled Crystal Oscillator, comprising:
   forming a groove on one side of a Printed Circuit Board;
   mounting a signal generating element of the Oven Controlled Crystal Oscillator in the groove;
   mounting a heating device against the other side of the Printed Circuit Board that is opposite to the groove; and
   mounting the Printed Circuit Board, provided with the heating device and the signal generating element, in a thermostatic bath.

8. The method for manufacturing an Oven Controlled Crystal Oscillator of claim 7, further comprising:
   forming a plurality of thermal conductive through holes passing through the Printed Circuit Board at the bottom of the groove.

9. The method for manufacturing an Oven Controlled Crystal Oscillator of claim 7, further comprising:
   forming a plurality of thermal conductive through holes passing through the PCB at the bottom of the groove and around the groove.

10. The method for manufacturing an Oven Controlled Crystal Oscillator of claim 7, wherein
    the depth of the groove is larger than the thickness of the signal generating element; or
    the depth of the groove is smaller than or equal to the thickness of the signal generating element.

* * * * *